(12) United States Patent
Lin et al.

(10) Patent No.: US 12,159,808 B2
(45) Date of Patent: *Dec. 3, 2024

(54) WIRE BOND DAMAGE DETECTOR INCLUDING A DETECTION BOND PAD OVER A FIRST AND A SECOND CONNECTED STRUCTURES

(71) Applicant: Texas Instruments Incorporated, Dallas, TX (US)

(72) Inventors: Hung-Yun Lin, Murphy, TX (US); Siva Prakash Gurrum, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/075,288

(22) Filed: Dec. 5, 2022

(65) Prior Publication Data

US 2023/0100709 A1    Mar. 30, 2023

Related U.S. Application Data

(63) Continuation of application No. 16/815,130, filed on Mar. 11, 2020, now Pat. No. 11,521,904.

(51) Int. Cl.
*H01L 21/66* (2006.01)
*G01R 1/067* (2006.01)
(Continued)

(52) U.S. Cl.
CPC .............. *H01L 22/32* (2013.01); *G01R 1/067* (2013.01); *G01R 31/52* (2020.01);
(Continued)

(58) Field of Classification Search
CPC .... G01R 31/52; G01R 1/067; G01R 31/2853; G01R 31/067; H01L 2224/04042; H01L 2224/056; H01L 2224/05624; H01L 2224/05647; H01L 2224/06135; H01L 2224/45099; H01L 2224/85205;
(Continued)

(56) References Cited

U.S. PATENT DOCUMENTS 5,468,999 A *  11/1995  Lin .................... H01L 24/06
                                                       257/784
6,063,650 A *  5/2000   King .................. H01L 24/06
                                                       438/118
(Continued)

*Primary Examiner* — Khiem D Nguyen
(74) *Attorney, Agent, or Firm* — Ronald O. Neerings; Frank D. Cimino

(57) ABSTRACT

An integrated circuit (IC) includes semiconductor substrate with a metal stack including a lower, upper and a top metal layer that includes bond pads and a detection bond pad (DBP). A wirebond damage detector (WDD) includes the DBP over a first and second connected structure. The first and second connected structures both include spaced apart top segments of the upper metal layer coupled to spaced apart bottom segments of the lower metal layer. The DBP is coupled to one end of the first connected structure, and ≥1 metal trace is coupled to another end extending beyond the DBP to a first test pad. The second connected structure includes metal traces coupled to respective ends each extending beyond the DBP to a second test pad and to a third test pad.

23 Claims, 7 Drawing Sheets

(51) Int. Cl.
  *G01R 31/52* (2020.01)
  *H01L 23/00* (2006.01)
  *H01L 23/495* (2006.01)
  *H01L 23/522* (2006.01)
  *H01L 23/528* (2006.01)

(52) U.S. Cl.
  CPC .... *H01L 23/49503* (2013.01); *H01L 23/4952* (2013.01); *H01L 23/5226* (2013.01); *H01L 23/528* (2013.01); *H01L 24/48* (2013.01); *H01L 2224/48175* (2013.01)

(58) Field of Classification Search
  CPC ........... H01L 2224/4811; H01L 23/528; H01L 22/32; H01L 22/34; H01L 23/49501; H01L 23/4952; H01L 23/5226; H01L 24/05; H01L 24/48; H01L 23/49503
  See application file for complete search history.

(56) References Cited

U.S. PATENT DOCUMENTS

| | | | |
|---|---|---|---|
| 6,265,778 B1* | 7/2001 | Tottori | H01L 23/5283 257/E23.152 |
| 7,250,311 B2 | 7/2007 | Aoki et al. | |
| 7,394,270 B2 | 7/2008 | Jimi | |
| 8,138,616 B2* | 3/2012 | Chang | H01L 23/522 257/784 |
| 8,183,698 B2* | 5/2012 | Antol | H01L 23/528 257/784 |
| 8,330,159 B2 | 12/2012 | Large et al. | |
| 10,006,946 B2* | 6/2018 | Prasad Chennupati | H02H 1/0007 |
| 10,330,726 B2 | 6/2019 | Werhane et al. | |
| 11,521,904 B2* | 12/2022 | Lin | H01L 24/48 |
| 2005/0023700 A1* | 2/2005 | Singh | H01L 24/05 257/773 |
| 2007/0018340 A1 | 1/2007 | Kim et al. | |
| 2009/0321889 A1 | 12/2009 | Summerfelt et al. | |
| 2013/0140565 A1 | 6/2013 | Mo et al. | |
| 2014/0252641 A1* | 9/2014 | Lim | H01L 24/97 438/618 |
| 2016/0027731 A1* | 1/2016 | Mori | H01L 22/32 257/774 |
| 2019/0115331 A1* | 4/2019 | Murtuza | H01L 23/5386 |
| 2020/0075435 A1* | 3/2020 | Chen | H01L 21/82 |

\* cited by examiner

WIRE BOND DAMAGE DETECTOR INCLUDING A DETECTION BOND PAD OVER A FIRST AND A SECOND CONNECTED STRUCTURES

CROSS-REFERENCE TO RELATED APPLICATIONS

This application is a continuation of co-pending application Ser. No. 16/815,130 filed Mar. 11, 2020, issued as U.S. Pat. No. 11,521,904, the contents of which are incorporated herein by reference in its entirety.

This Disclosure relates to wirebond damage detection for integrated circuits.

BACKGROUND

The fabrication of semiconductor devices is known to be a multi-step process that includes a wafer-fabrication step and an assembly step. Wafer fabrication includes adding layers of materials on a substrate having a semiconductor surface, commonly a single crystal silicon substrate that may include a top side epitaxial layer. The layers formed on the semiconductor surface are each generally patterned by photo-masking and etching. Typically, the topmost layers of the device include a plurality of metal layers separated by an inter-level dielectric (ILD) layer having metal filled vias therethrough, where the metal layers include metal lines (also called traces) for connecting to various components on the lower layers.

Wafer fabrication generally produces a wafer that comprises a large number of integrated circuits (ICs). Assembly conventionally includes singulating the wafer into individual IC die, attaching each IC die to a corresponding leadframe, wirebonding to provide bond wires connecting bond pads on each IC die and leads or lead terminals on the corresponding leadframe, and then encapsulating each IC die, bond wires, and corresponding leadframe in a plastic package. Alternative assembly processes can also be used for particular IC types, such as a ball grid array (BGA) type IC die which enables connection to a non-leadframe such as to a printed circuit board (PCB).

The wirebonding can result in damage to the IC die induced during the wirebonding process when a bondwire is attached to bond pads on the IC die. This is because wirebonding to a bond pad generally includes the application of pressure, ultrasonic energy, and/or heat, which results in mechanical stress applied onto the surface of the bond pad that is transmitted to the structure underneath the bond pad including metal and dielectric layers. The mechanical stress can potentially damage those underlying structures. One known solution is to make the underlying dielectric layers mechanically stronger to become more resistant to being damaged under the mechanical stress of wirebonding, while another known solution is to reduce the pressure and/or level of ultrasonic energy applied by the wirebonding apparatus to the bond pad during the wirebonding process.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize there is an unmet need for identifying both open circuits and leakage such as in the case of short-circuits, induced on the IC by the mechanical stress (pressure and/or ultrasonic energy) applied to the bond pads during wirebonding. Disclosed aspects solve this unmet need by including a wirebond damage detector (WDD) that comprises a first connected structure and an adjacent second connected structure that are both under a bond pad that is termed herein a 'detection bond pad' (DBP). The term 'connected structures' as used herein means designed to be electrically continuous, but not forming an enclosed structure, referred to herein as being open-ended loops, which permits electrical contact to be made on respective ends. Open circuits can be detected using either of the connected structures by voltage biasing one end with respect to the other end, and then sensing for current that is expected to flow, while leakage can be detected by applying a bias between the respective connected structures and sensing for current that is not expected to flow.

Disclosed aspects include an IC including a semiconductor substrate with a metal stack including a lower, upper and a top metal layer that includes bond pads and a DBP. A WDD is on the IC that includes the DBP over a first and a second connected structure. The first and second connected structures both include spaced apart top segments of the upper metal layer coupled to spaced apart bottom segments of the lower metal layer. The DBP is coupled to one end of the first connected structure, and at least 1 metal trace is coupled to another end extending beyond the DBP to a first test pad. The second connected structure includes metal traces coupled to respective ends of the second connected structure each extending beyond the DBP to a second test pad and to a third test pad.

BRIEF DESCRIPTION OF THE DRAWINGS

Reference will now be made to the accompanying drawings, which are not necessarily drawn to scale, wherein.

DETAILED DESCRIPTION

Figure 1A:
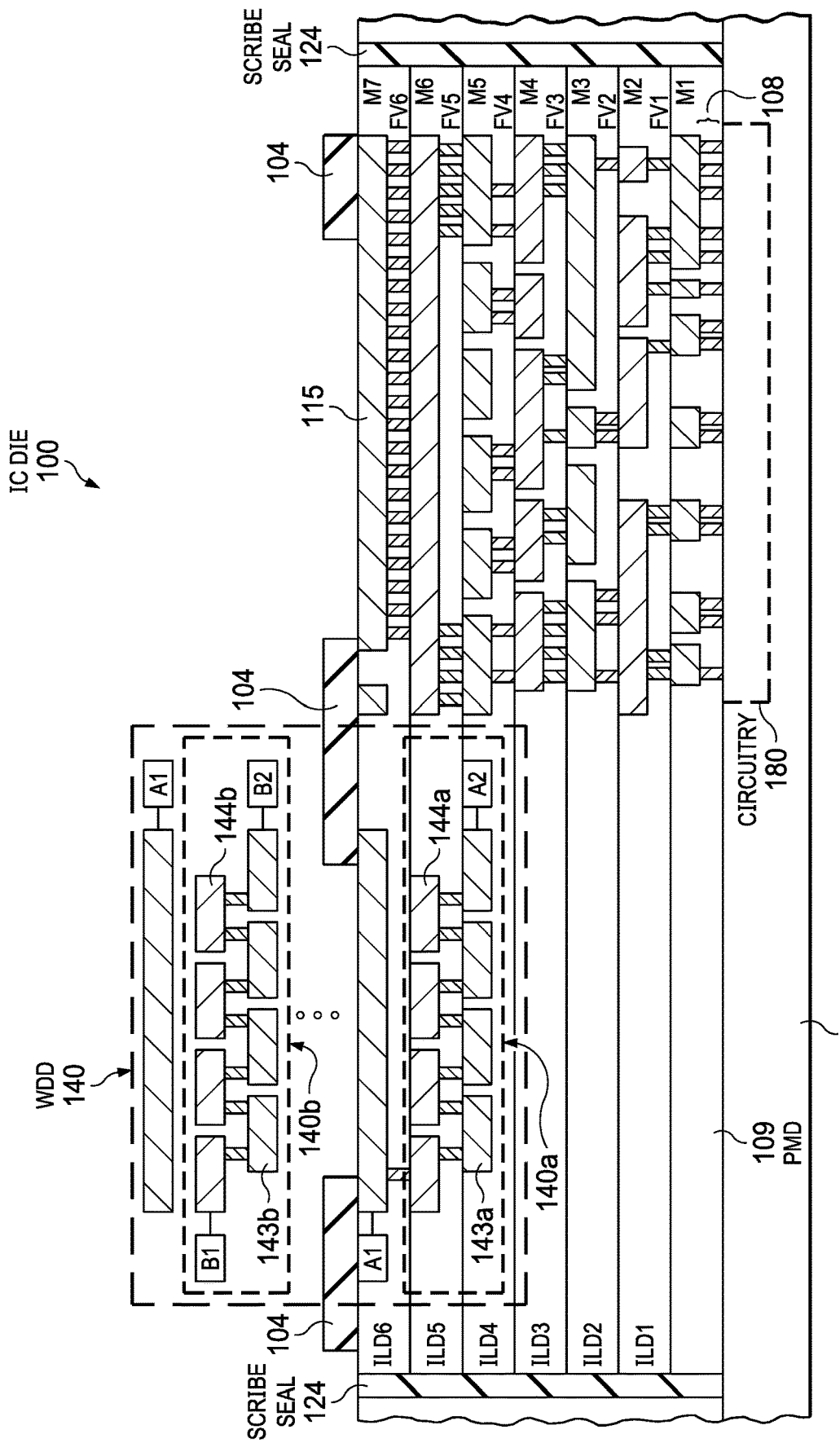
FIG. 1A shows a cross-sectional view of an IC die with a disclosed WDD comprising a first connected structure and a second connected structure located at the edge of the IC positioned within the scribe seal. The test pads of the WDD are shown as A1, A2, B1, B2, where A1 is the DBP itself. The first and the second connected structures each comprise spaced apart top segments and spaced apart bottom segments all under the DBP/A1, and there are filled vias (FV) between M7 and M6 shown as FV6, and FVs between M6 and M5 shown as FV5.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1A shows a cross-sectional view of an IC die 100 comprising a substrate 105 including a semiconductor surface that has circuitry 180 formed therein, which includes a disclosed WDD 140 including a first connected structure 140a and a second connected structure 140b shown located at the edge of the IC die 100 positioned within the scribe seal 124. The second connected structure 140b is only visible in this enhanced view, which does not correspond to a real cross-sectional view because the second connected structure 140b is laterally offset from the first connected structure 140a.

The IC die 100 has a plurality of bond pads with a single conventional bond pad 115 being shown only for simplicity. The conventional bond pad 115 can be seen to be connected through the various metal layers shown as M1 to M7 (being the top metal layer), which together with FVs comprising FV1 to FV6 through the ILD's shown as ILD 1 to ILD 6, with ILD 6 being the top ILD layer, are between all the metal layers to enable connection to a node in the circuitry 180. There is a pre-metal dielectric (PMD) layer 109, such as comprising silicon oxide, between the top of the semiconductor surface of the substrate 105 and M1, where the PMD layer 109 has metal filled contacts 108 therethrough to connect to the semiconductor surface to M1.

The circuitry 180 comprises circuit elements (including transistors, and generally diodes, resistors, capacitors, etc.), that can in one arrangement be formed in an epitaxial layer on the bulk substrate material configured together for generally realizing at least one circuit function. Example circuit functions include analog (e.g., amplifier or power converter), radio frequency (RF), digital, or non-volatile memory functions.

The test pads of the WDD 140 are shown as A1, A2, B1, B2, where A1 is shown by example as the DBP itself for the first connected structure 140a and for second connected structure 140b. A1 is shown formed from M7 (or other top layer metal layer for a metal stack not having 7 metal layers). A1 being the DBP, unlike conventional bond pads such as conventional bond pad 115, is not connected or coupled in any way to the circuitry 180. The first connected structure 140a and second connected structure 140b are both under A1, and are both electrically continuous (but not enclosed) structures, that can be considered open-ended loops, that each comprise a plurality of spaced apart top segments 144a (for the first connected structure 140a), and 144b (for the second connected structure 140b) comprising the upper metal layer shown as M6 connected by FV5's to the next lower metal layer shown as M5 that comprises a plurality of bottom spaced apart segments 143a (for the first connected structure 140a), and 143b (for the second connected structure 140b).

The WDD 140 can be designed to be more sensitive to bond induced damage as compared to the semiconductor area within the circuitry 180. In this arrangement, at least one of a line width of the spaced apart bottom segments 143a, 143b in M5 and the spaced apart top segments 144a, 144b in M6, and a spacing between the spaced apart bottom segments 143a, 143b and the spaced apart top segments 144a, 144b is at least 10% more aggressive for the WDD wirebond damage detector as compared to anywhere over the circuitry 180 to increase detection sensitivity for wirebond damage. For example, relative to the circuitry 180 there may be a larger metal line width for the spaced apart top segments of M6 144a and 144b and spaced apart bottom segments of M5 143a, 143b, and a smaller spacing between the spaced apart top segments of M6 144a, 144b and the spaced apart bottom segments of M5 143a, 143b.

The WDD 140 has at least one FV between M7 and M6 shown as FV6, and FVs between M6 and M5 shown as FV5. The segmented metal design shown for the first and second connected structures 140a, 140b may be referred to as being 'daisy chains.' In their respective connected structures, the plurality of spaced apart top segments 144a, 144b are shown offset in a length dimension from the plurality of bottom spaced apart second segments 143a, 143b.

The WDD 140 can be optionally located on the IC die 100 so that after wafer singulation into singulated die, the WDD 140 remains on the IC die to permit it to be used during package testing including for a final screening at final package test (see FIG. 1B and FIG. 1C described below). For enabling final test screening at the package test level, bond wires are attached from the test pads of the WDD 140 (A1, A2, B1 and B2) on the IC die 100 to leads or lead terminals provide pins of a package, such as shown in by the packaged IC 300 in FIG. 3 that is described below.

It is also possible for the WDD 140 to be located in the scribe street (see FIG. 1D describe below). When the WDD is located in the scribe street, although the WDD is not capable of being measured for bondwire induced damage while in a package because the WDD 140 is generally removed during wafer singulation, this arrangement still has utility to enable measuring for bondwire induced damage that can be simulated by contact by a probe of a wafer prober while in wafer form during a wafer probe operation, and also measured for opens and leakage (e.g., shorts) during wafer probe as well.

M7 is partially overlaid with at least one passivation layer(s) 104, which has an inner opening, or window, to expose a portion of the conventional bond pad 115 as well as the bond pad A1 to enable wirebonding thereto. M7 may comprise aluminum or copper, or other metal or metal alloy. The passivation layer 104 can comprise silicon nitride ($Si_3N_4$), silicon oxide, silicon oxynitride, or two or more of these layers in the case of a multi-layer passivation layer arrangement.

Figure 1B:
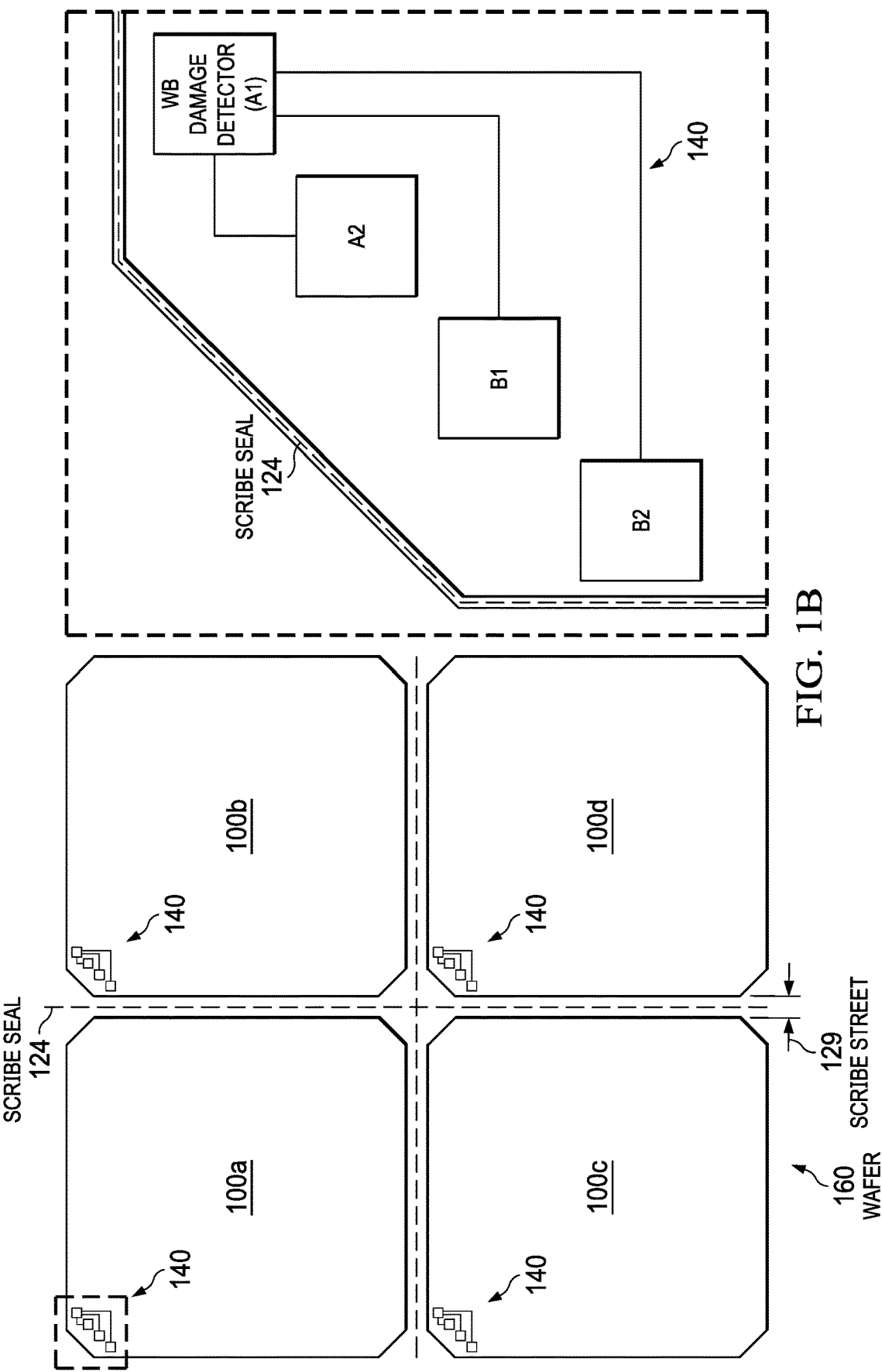
FIG. 1B shows a depiction of a portion of a wafer shown having four IC, where for each of the IC die a disclosed WDD and its test pads are positioned inside the functional portion (thus inside the scribe seal) of the IC die. A blowup of the WDD showing the scribe seal is also provided to the right of this FIG. As known in the art, the scribe seal can comprise a crack stop and an edge seal.

FIG. 1B shows a depiction of a portion of a wafer 160 shown having four IC die shown as 100a, 100b, 100c and 100d, where for each of the IC die a disclosed WDD 140 and its test pads are positioned inside the functional portion (thus inside the scribe seal 124) of the IC die. A blowup of the WDD 140 showing the scribe seal 124 is also provided to the right of this FIG. As known in the art, the scribe seal 124 can comprise a crack stop and an edge seal. The scribe seal 124 shown within the scribe street 129.

Figure 1C:
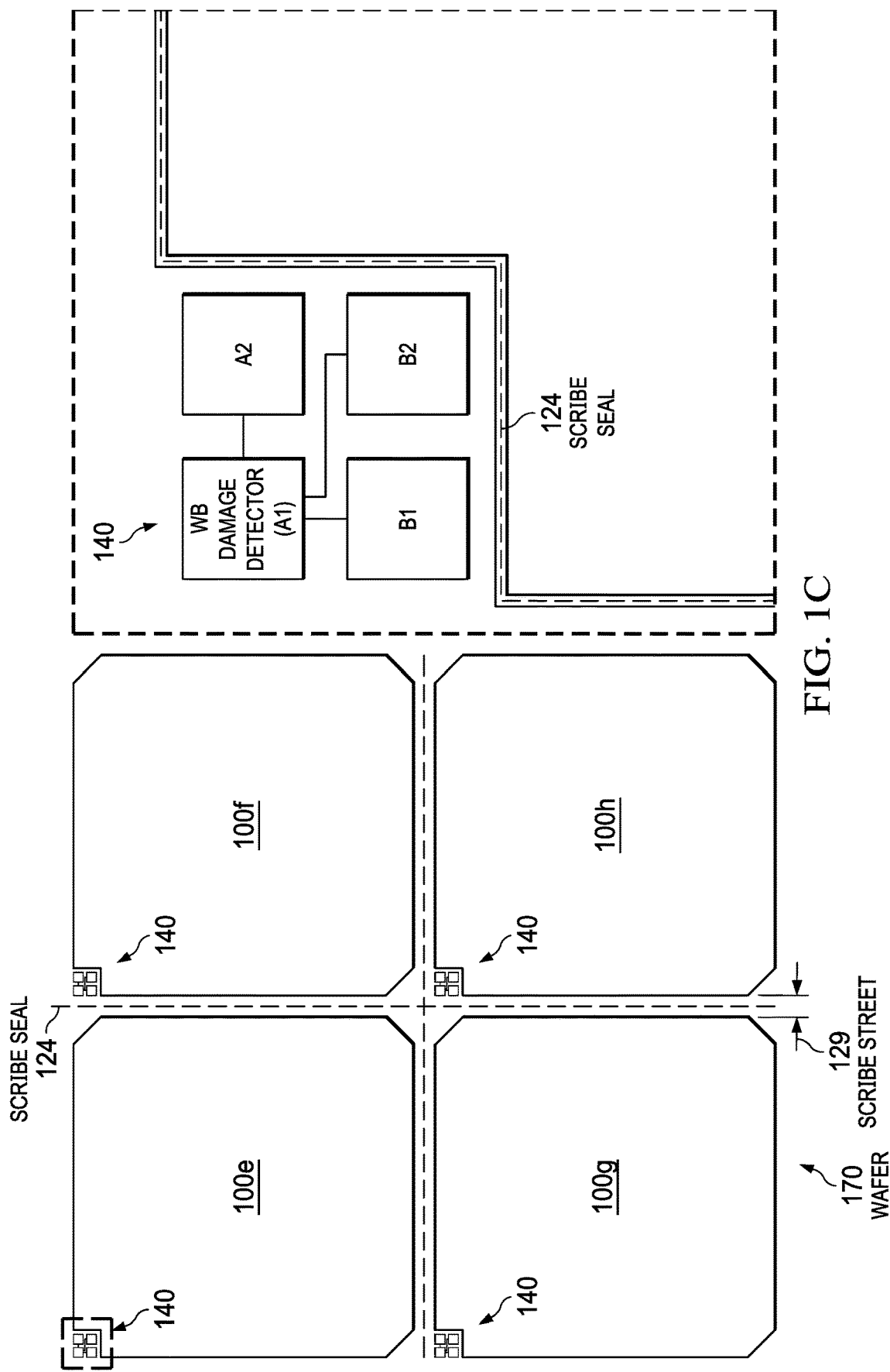
FIG. 1C shows a depiction of a portion of a wafer again shown having four IC die, where each of the IC die include a disclosed WDD, with its test pads positioned outside the functional die area within an indented area portion of the scribe seal. A blowup of the WDD showing the scribe seal with the WDD in its indented portion is also provided to the right of this FIG. 1n this arrangement, the WDD remains on the IC die after wafer singulation.

FIG. 1C shows a depiction of a portion of a wafer 170 again shown having four IC die shown as 100e, 100f, 100g and 100h, where for each of the IC die a disclosed WDD 140 and its test pads are positioned outside the functional die (within the circuitry 180 shown in FIG. 1A) area within an indented area portion of the scribe seal 124. A blowup of the WDD 140 showing the scribe seal 124 with the WDD 140 in its indented portion is also provided to the right of this FIG. 1n this arrangement, the WDD 140 remains on the IC die after wafer singulation.

Figure 1D:
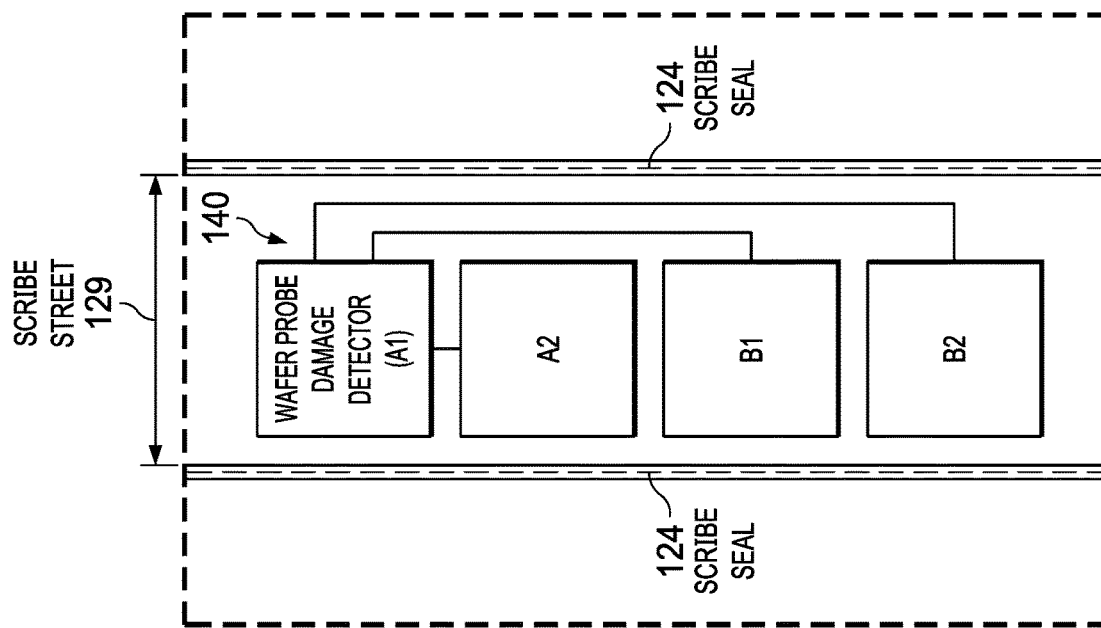
FIG. 1D shows a depiction of a portion of a wafer again shown having four IC die, where between adjacent IC die in the scribe street outside the scribe seal there is a disclosed WDD and its test pads. A blowup of the WDD showing a WDD between the scribe seal of respective IC die is also provided to the right of this FIG. Since the WDD are generally removed during wafer singulation for this WDD arrangement, this arrangement is configured for measuring bondwire induced damage that is simulated during a wafer probe operation by contact by a probe of a wafer prober while a plurality of the ICs are in wafer form.
Figure 1D:
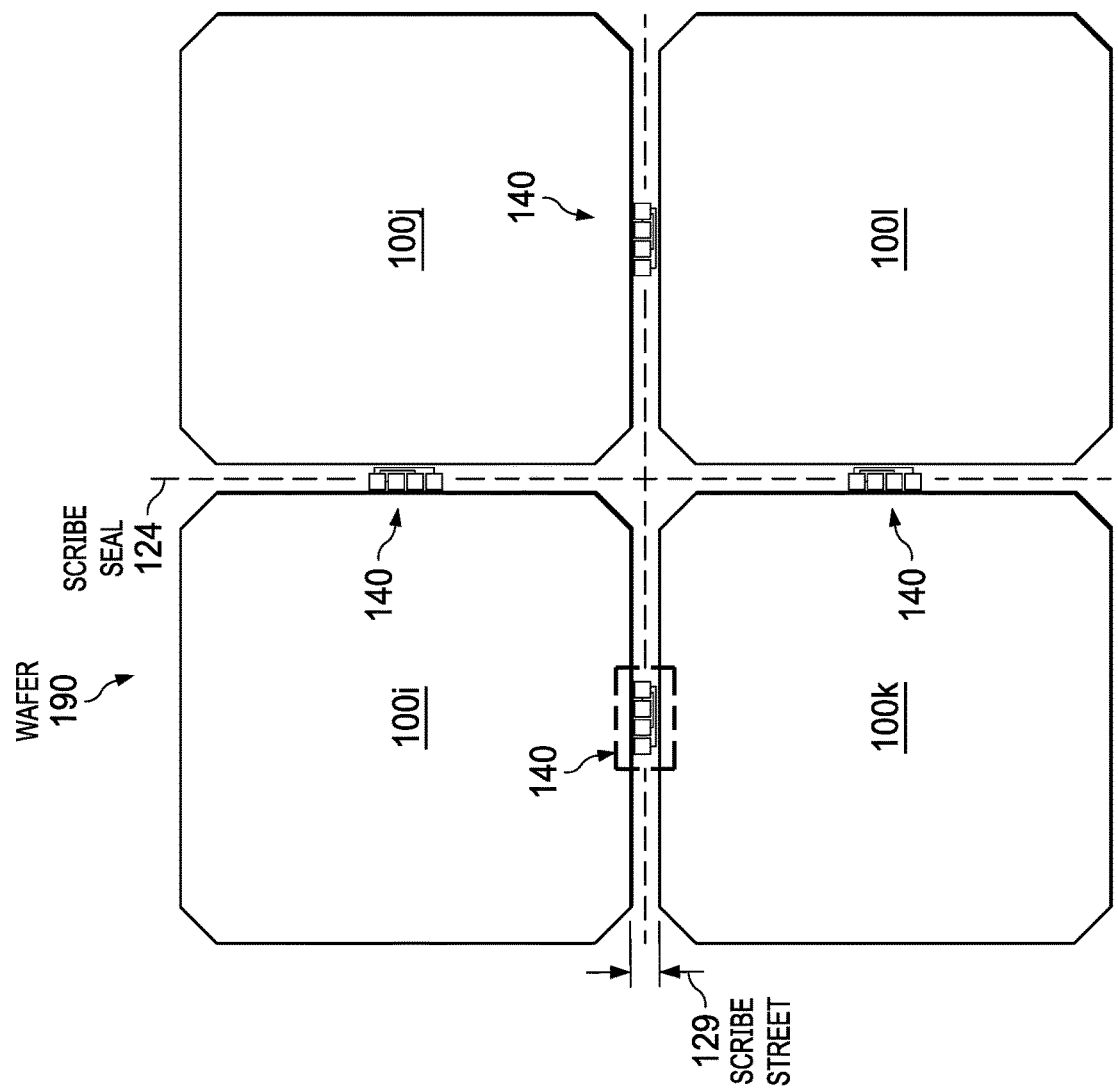

FIG. 1D shows a depiction of a portion of a wafer 190 again shown having four IC die shown as 100i, 100j, 100k and 100l, where between adjacent IC die in the scribe street 129 outside the scribe seal 124 there is a disclosed WDD 140 and its test pads. A blowup of a WDD showing a WDD 140 between the scribe seal 124 of respective IC die is also provided to the right of this FIG. Since the WDD 140 in this arrangement are generally removed during wafer singulation, the WDD 140 are generally only used as a wafer probe damage detector. The scribe street 129 may be 60 to 120 μms wide. There may also be an alignment mark in the scribe street 129.

Figure 2A:
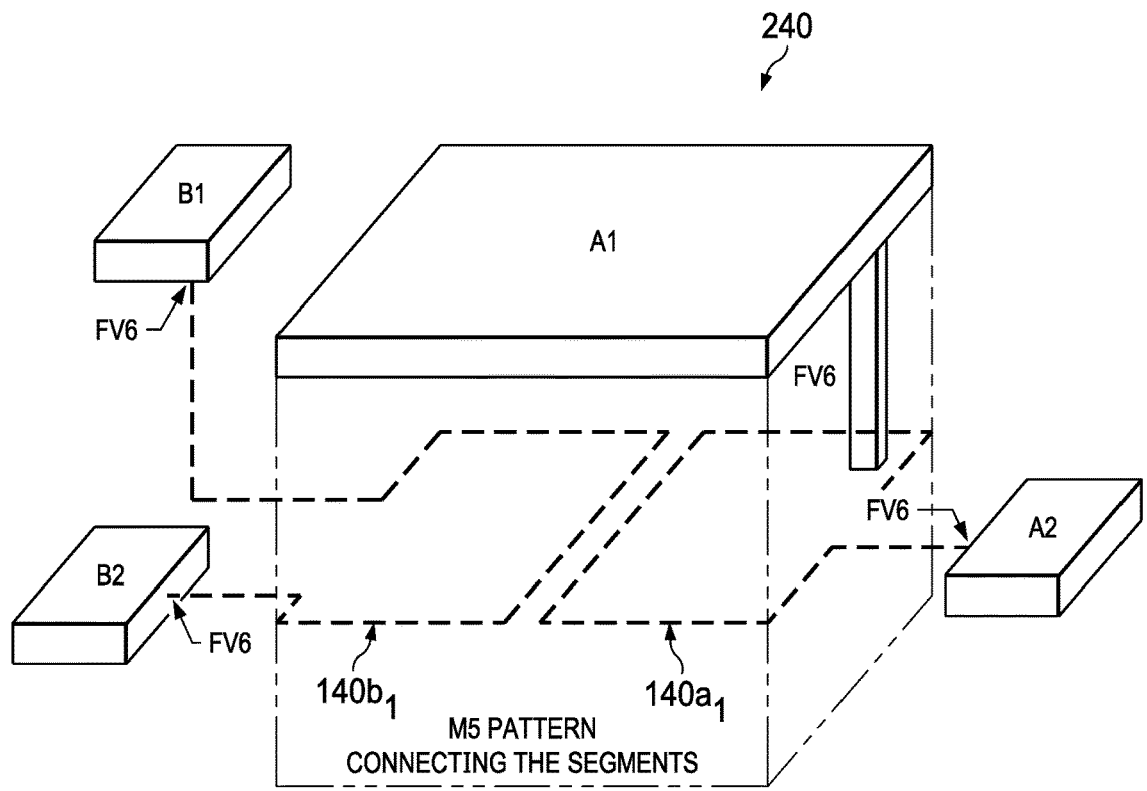
FIG. 2A shows an example WDD where the first and the second connected structures are side-by-side.
Figure 2B:
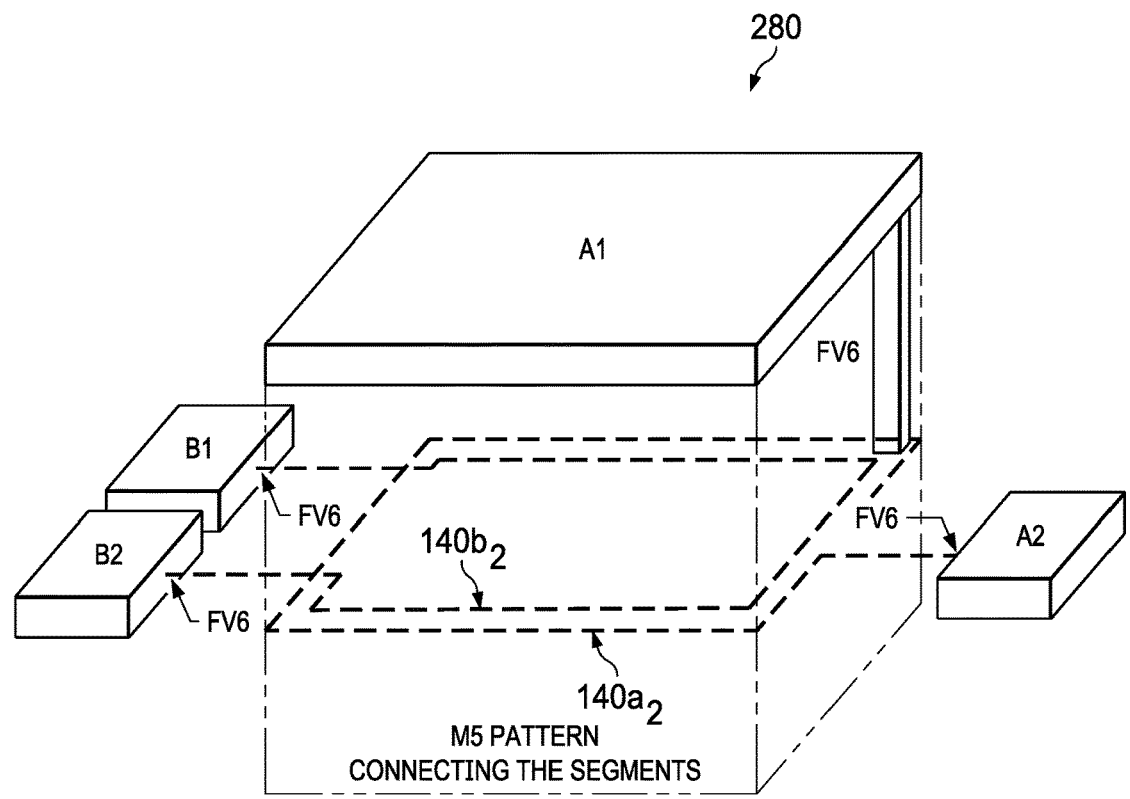
FIG. 2B shows an example WDD where the second connected structure is within an area defined by the first connected structure.

FIG. 2A shows an example WDD 240 where the first connected structure 140a₁ and the second connected structure 140b₁ are both configured as open-ended loops that are side-by-side. FIG. 2B shows an example WDD 280 where first connected structure 140a₁ and the second connected structure 140b₁ are both configured as open-ended loops, and the second connected structure 140b₂ is within an area defined by the first connected structure 140a₂.

Figure 2C:
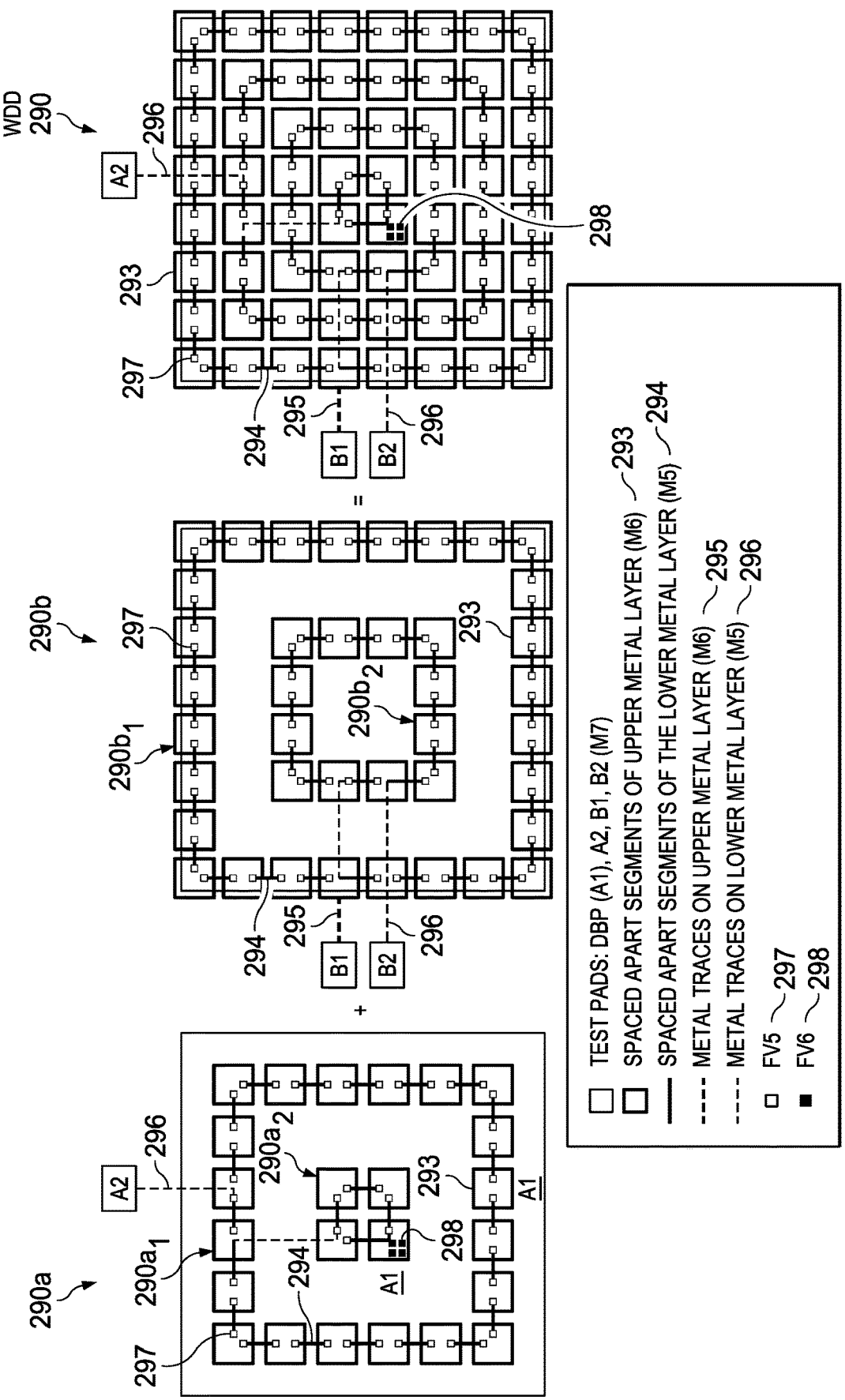
FIG. 2C shows an example WDD on the right side shown as having two components beginning from the left side comprising a first connected structure and a second connected structure that each have two open-ended loops, where each loop is adjacent to loop(s) from the other connected structure.

FIG. 2C shows an example WDD 290 on the right side shown as having two components beginning from the left side a first connected structure 290a and a second connected structure 290b that each comprise two open-ended loops, where each loop is adjacent to loop(s) from the other connected structure. For feature consistency with the IC die 100 shown in FIG. 1 described above, in this example for WDD 290 the top metal layer providing the test pads is again M7, the upper metal level is again M6, and the lower metal layer is again M5.

The first connected structure 290a and the second connected structure 290b each comprise multiple open-ended loops (with a gap so that they are not enclosed structures) each shown as having two loops, loops 290a₁ and 290a₂ for the first connected structure 290a, and loops 290b₁ and 290b₂ for the second connected structure 290b. Each loop comprises the M6 segments 293 coupled by metal traces (which can be considered to be routing lines) on M5 294, metal traces on M6 295 including to traces that connect from the loops to the respective test pads, FV5s 297 for connecting M5 to M6 (through ILD5 shown in FIG. 1), and FV6s 298 for connecting M6 to M7 (through ILD6 shown in FIG. 1).

There are also test pads comprising M7 including A1 (the DBP), A2 for the first connected structure 290a, and test pads B1 and B2 for the second connected structure 290b. When the first connected structure 290a and a second connected structure 290b are overlaid it can be seen when viewing WDD 290 that each loop is adjacent to loop(s) from the other connected structure, so that WDD 290 provides what can be considered to be nested loops.

The loops 290a₁ and 290a₂ for the first connected structure 290a together with the and loops 290b₁ and 290b₂ from the second connected structure 290b can be seen to collectively occupy essentially an entire area under A1. Because when combined the first and second connected structures 290a, 290b as shown for WDD 290 do not cover the full area under A1 due to gaps between the M6 segments 293, covering essentially an entire area under A1 as used herein means the first and second connected structures 290a, 290b form nested loops collectively occupying at least 80% of the area under A1.

Figure 3:
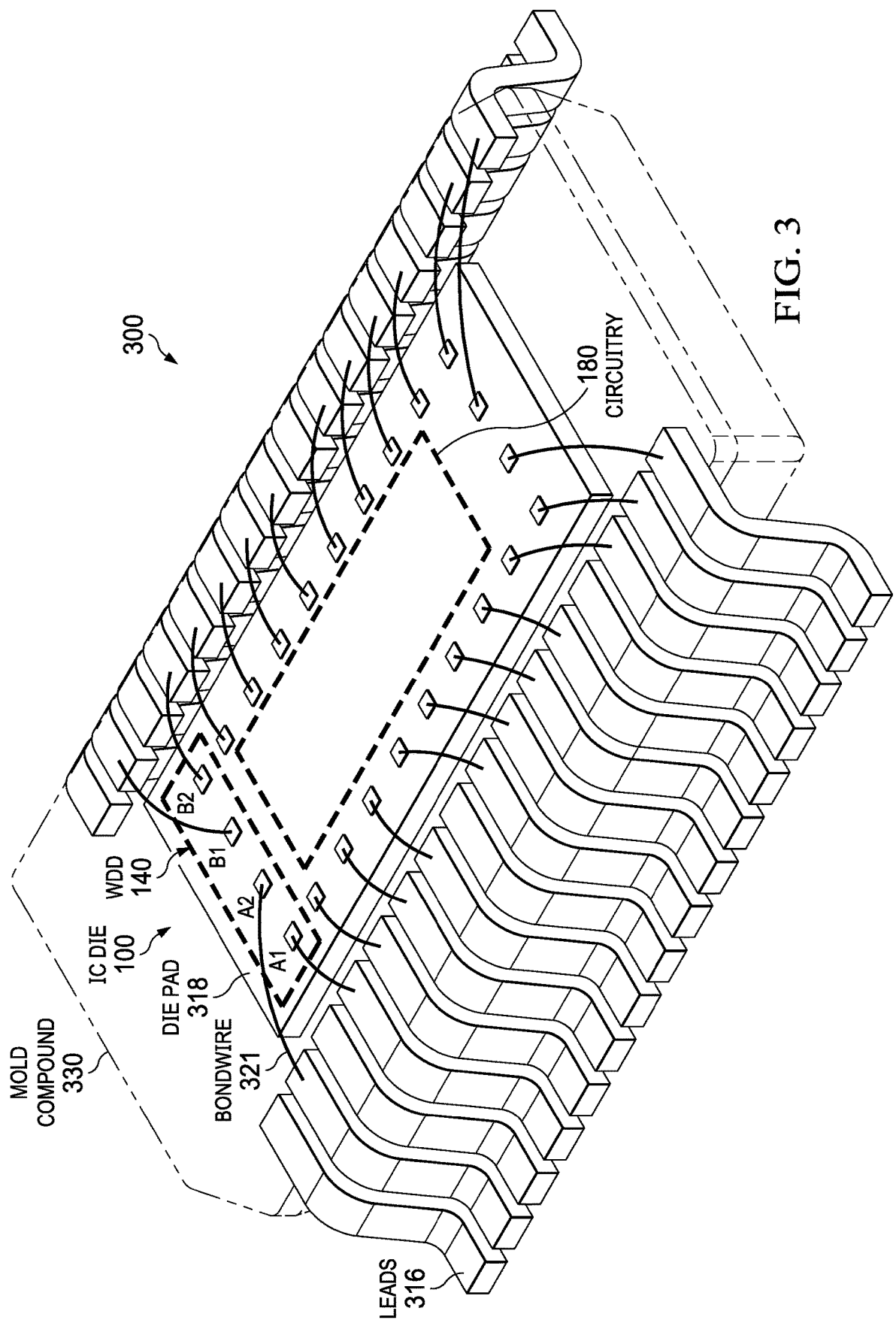
FIG. 3 shows an example packaged IC with the mold compound cut to reveal a disclosed WDD having its 4 test/bond pads bonded out with bondwires that are coupled to leads of the leadframe to provide pins for the packaged IC, which enables wirebond damage testing the IC die at package test.

FIG. 3 shows an example packaged IC 300 comprising an IC die 100 including circuitry 180 and a disclosed WDD 140 on a die pad 318 of the leadframe, with the mold compound 330 cut to reveal the WDD 140 having its 4 test/bond pads (shown as A1, A2, B1 and B2 above) bonded out. There are bondwires 321 shown coupled to leads 316 of the leadframe to provide pins for the packaged IC 300, including separate pins for A1, A2, B1 and B2, which enables wirebond damage testing the IC die 100 at the package level. Although the packaged IC 300 is shown having 32 pins so that the pins for contacting the WDD 140 comprise about 10% of the total pins for the packaged IC 300, in the case of a large pin count packaged device, such as an automotive packaged device which generally has at least 100 pins, the pins used by a disclosed WDD would represent only a small percentage of the total pins of the packaged device.

A method of WDD includes providing at least one IC, such as the IC die 100 shown in FIG. 1A, and applying a downward force, and generally also ultrasonic energy to the DBP. In an older wirebond process, thermal-compression bonding may be used instead of ultrasonic energy. A voltage bias is applied across the first connected structure and across the second connected structure (looking for open circuits), and/or between the first connected structure and the second connected structure (looking for leakage or short circuits). An electrical measurement is performed while applying the voltage bias, generally being detecting the resulting current.

A disclosed method can comprise providing at least one IC comprising a semiconductor substrate including circuitry configured for a function including a multi-layer metal stack comprising a lower, upper and a top metal layer, wherein the top metal layer includes a plurality of bond pads connected to nodes in the circuitry and a DBP. A WDD is on the IC or on the semiconductor substrate adjacent to the IC. The WDD includes the DBP over a first and a second connected structure.

The first connected structure comprises a plurality of spaced apart top segments comprising the upper metal layer coupled to a plurality of spaced apart bottom segments comprising the lower metal layer, where the DBP is coupled to one end of the first connected structure, and at least one metal trace is coupled to a second end of the first connected structure extending beyond the DBP to a first test pad. A second connected structure comprises a plurality of spaced apart top segments comprising the upper metal layer connected to a plurality of spaced apart bottom segments comprising the lower metal layer, and there are metal traces coupled to a first and a second end of the second connected structure each extending beyond the DBP to a second test pad and a third test pad.

A downward force, and generally also ultrasonic energy, is applied to the DBP. A voltage bias is applied across the first connected structure and/or across the second connected structure for looking for open circuits, and/or a voltage biases applied between the first connected structure and the second connected structure for looking for leakage or short circuits. An electrical measurement is performed while applying the voltage bias.

The method can further comprise using results of the electrical measurement to select wirebonding parameters. For example, a lower bonding force, lower ultrasonic energy, and/or a lower temperature during wirebonding, for a wirebonding process for placing bondwires between bond pads on IC die and leads or lead terminals of a leadframe. In one arrangement, the IC comprises a packaged semiconductor device including a leadframe, a die pad, and a plurality of leads or lead terminals on at least two sides of the die pad, further comprising bondwires between the bond pads, the DBP, and the first, second, and third test pad and the leads or the lead terminals, wherein the method can be implemented at final test of the packaged semiconductor device.

Disclosed aspects can be integrated into a variety of assembly flows to form a variety of different semiconductor integrated circuit (IC) devices and related products. The assembly can comprise single semiconductor die or multiple semiconductor die, such as configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. An integrated circuit (IC), comprising:
a semiconductor substrate including circuitry configured for a function;
a wirebond damage detector on the IC, including:
a detection bond pad;
a first connected structure comprising a plurality of spaced apart top segments comprising an upper metal layer coupled to a plurality of spaced apart bottom segments comprising a lower metal layer, where the detection bond pad is coupled to one end of the first connected structure; and
a second connected structure comprising a plurality of spaced apart top segments comprising the upper metal layer connected to a plurality of spaced apart bottom segments comprising the lower metal layer.

2. The IC of claim 1, wherein a top metal layer is separated from the upper metal layer by a topmost inter level dielectric (ILD) layer, wherein the upper metal layer is separated from the lower metal layer by a next to topmost ILD layer, with topmost metal filled vias through the topmost ILD for connecting the top metal layer to the upper metal layer and next to topmost metal filled vias through the next to topmost ILD layer for connecting the upper metal layer to the lower metal layer,
wherein the detection bond pad is coupled by the topmost metal vias to the one end of the first connected structure.

3. The IC of claim 1, wherein the first and the second connected structure are side-by-side.

4. The IC of claim 1, wherein the second connected structure is within an area defined by the first connected structure.

5. The IC of claim 1, wherein the wirebond damage detector is positioned in a scribe street of a wafer including a plurality of the IC.

6. The IC of claim 1, wherein the wirebond damage detector is within an area defined by the circuitry or is outside the area defined by the circuitry but within a scribe seal region of the IC.

7. The IC of claim 1, wherein the plurality of spaced apart top segments are offset in a length dimension from the plurality of spaced apart bottom segments.

8. The IC of claim 1, wherein at least one of a line width of the lower and the upper metal layers and a spacing between the spaced apart top segments and the spaced apart bottom segments is at least 10% more aggressive for the wirebond damage detector as compared to anywhere over the circuitry.

9. The IC of claim 1, wherein the first and the second connected structures collectively form nested loops occupying at least 80% of an area under the detection bond pad, and wherein additional metal traces on the upper metal layer and the lower metal layer connect to the nested loops belonging to each of the first and the second connected structures.

10. The IC of claim 1, wherein the first connected structure and the second connected structure are loop structures.

11. The IC of claim 10, wherein the loop structures are open-ended loops.

12. The IC of claim 10, wherein the loop structures are nested loop structures.

13. The IC of claim 12, wherein the nested loop structures are open-ended loops.

14. A method of wirebond damage detection, comprising:
providing at least one integrated circuit (IC) comprising a semiconductor substrate including circuitry configured for a function including a multi-layer metal stack comprising a lower metal layer, an upper metal layer and a top metal layer, wherein the top metal layer includes a plurality of bond pads connected to nodes in the circuitry and a detection bond pad, a wirebond damage detector on the IC or on the semiconductor substrate adjacent to the IC, the wirebond damage detector including the detection bond pad over a first and a second connected structure, applying a downward force to the detection bond pad;
applying a voltage bias across at least one of the first connected structure and across the second connected structure, or between the first connected structure and the second connected structure, and
performing an electrical measurement while the applying of the voltage bias.

15. The method of claim 14, wherein the performing of the electrical measurement comprises probing a wafer including a plurality of the IC, wherein a probe tip used for the probing is for the applying of the downward force.

16. The method of claim 14, where the applying comprises the voltage bias across the first connected structure or across the second connected structure, and then sensing a resulting current so that the detection is for identifying an open circuit.

17. The method of claim 14, wherein the applying comprises the applying the voltage bias between the first connected structure and the second connected structure, and then sensing for leakage current so that the detection is for leakage or for detecting a short-circuit between the first connected structure and the second connected structure.

18. The method of claim 14, further comprising using results of the electrical measurement to select wirebonding parameters for a wirebonding process for placing bondwires between bond pads on the IC die and leads or lead terminals of a leadframe.

19. The method of claim 14, wherein the IC comprises a packaged semiconductor device including a leadframe, a die pad, and a plurality of leads or lead terminals on at least two sides of the die pad, further comprising bondwires between the bond pads, the detection bond pad, and first, second, and third test pads and the leads or the lead terminals, and wherein the method is implemented at final test of the packaged semiconductor device.

20. A semiconductor package, comprising:
a leadframe including a die pad with a plurality of leads or lead terminals on at least two sides of the die pad;
an integrated circuit (IC) on the die pad comprising a semiconductor substrate including circuitry configured for a function including a multi-layer metal stack including a lower, upper and a top metal layer, wherein the top metal layer includes a plurality of bond pads connected to nodes in the circuitry and a detection bond pad; and
a wirebond damage detector over a first and a second connected structures.

21. The semiconductor package of claim 20, wherein at least one of a line width of the lower and the upper metal layers is at least 10% more aggressive for the wirebond damage detector as compared to anywhere in the circuitry.

22. The semiconductor package of claim 20, wherein for the IC,
the top metal layer is separated from the upper metal layer by a topmost inter level dielectric (ILD) layer, wherein the upper metal layer is separated from the lower metal layer by a next to topmost ILD layer, with topmost metal filled vias through the topmost ILD layer for connecting the top metal layer to the upper metal layer and next to topmost metal filled vias through the next to topmost ILD layer for connecting the upper metal layer to the lower metal layer;
wherein the detection bond pad is coupled by the topmost metal vias to a first connected structure.

23. The semiconductor package of claim 20, wherein the wirebond damage detector is within an area defined by circuitry, or is outside the area defined by the circuitry but within a scribe seal region of the IC.

* * * * *